US005226975A

United States Patent [19]

Denton et al.

[11] Patent Number: 5,226,975

[45] Date of Patent: Jul. 13, 1993

[54] PLASMA NITRIDE CHROMIUM PLATED COATING METHOD

[75] Inventors: James E. Denton; Buel D. Napier, both of Columbus, Ind.

[73] Assignee: Cummins Engine Company, Inc., Columbus, Ind.

[21] Appl. No.: 672,680

[22] Filed: Mar. 20, 1991

[51] Int. Cl.[5] .......... C23C 14/02

[52] U.S. Cl. .......... 148/220; 148/222; 148/230; 148/231; 205/228; 427/457; 427/569

[58] Field of Search .......... 148/220, 222, 230, 231; 204/192.31, 192.16; 427/38, 39; 205/228

[56] References Cited

U.S. PATENT DOCUMENTS

| | | | |
|---|---|---|---|
| 4,212,602 | 7/1980 | Buran et al. | 418/178 |
| 4,231,816 | 11/1980 | Cuomo et al. | 428/450 |
| 4,242,151 | 12/1980 | Leveque | 148/222 |
| 4,490,190 | 12/1984 | Speri | 148/222 |
| 4,871,434 | 10/1989 | Munz et al. | 204/192.16 |

OTHER PUBLICATIONS

Metals Handbook, 9th Ed.; vol. 5 pp. 170-175; 1982.

*Primary Examiner*—R. Dean
*Assistant Examiner*—Margery S. Phipps
*Attorney, Agent, or Firm*—Sixbey, Friedman, Leedom & Ferguson

[57] ABSTRACT

A method of forming a wear-resistant coating for internal combustion engine component parts which allows the part to remain dimensionally stable under severe engine operating conditions is provided. The coating is formed by a two step method. First, the engine part is coated with chromium to form a chromium base layer. Second, the chromium coated part is subjected to a reactive gas plasma in a reaction chamber at an elevated temperature and under an applied electrical potential. The gas of the plasma reacts with the chromium to form the wear-resistant layer. Preferably, the reactive gas is nitrogen which reacts with the chromium to form a chromium nitride surface layer on the chromium base layer. The coating formed in accordance with the present invention is especially suited for fuel injectors because the process may be conducted in essentially two steps so that any resizing of the fuel injector plunger can be done after formation of the chromium base layer, but before the wear-resistant surface layer is formed.

14 Claims, 6 Drawing Sheets

PLASMA NITRIDE CHROMIUM PLATED COATING METHOD

BACKGROUND OF THE INVENTION

Technical Field of the Invention

This invention generally relates to the production of wear-resistant coatings. More particularly, this invention relates to the production of a wear-resistant, dimensionally stable coating on internal combustion engine components such as fuel injector plungers.

Description of the Prior Art

The United States is currently undergoing a dramatic increase in environmental awareness. As a result, the internal combustion engine emission standards imposed by federal and state regulatory agencies are becoming more stringent. To meet these heightened emission standards, engines are now required to operate under more severe engine operating conditions than were previously required. Specifically, the higher engine temperatures and pressures needed for efficient fuel combustion cause engine component parts to become worn and to lose their dimensional integrity, thus reducing the engine's operating efficiency. This is especially true with fuel injector plungers because they are continuously subjected to very high temperatures and pressures during engine operation. Fuel injector plungers operate with very limited clearance space. Moreover, the plunger is a precision part and includes grooves and flow passages that are machined to very close tolerances to function within this limited space. If the fuel injector plunger becomes worn or loses its dimensional integrity, it will fail to efficiently inject fuel into the cylinder combustion chamber which will eventually affect the quality of the engine's emissions. Therefore, efficient engine operation requires the fuel injector plunger to resist wear and to maintain its dimensional integrity.

The prior art has proposed methods for coating internal combustion engine components to improve their wear-resistance. U.S. Pat. No. 4,212,602, issued to Buran et al., is directed to a wear-resistant coating for a sealing strip in a rotary engine. The coating consists essentially of chromium or a chromium alloy applied in a single step by plasma deposition welding. Specifically, the coating may be charged with a gas or a mixture of gases, such as hydrogen, nitrogen, or oxygen, before it is deposition welded onto the surface of the sealing strip. However, unlike the rotary engine components described in this patent a fuel injector must be sized and formed with precise grooves and flow passages, which is usually done by machining. A hard surface coating like that disclosed by Buran et al. is very difficult to machine, so that a fuel injector plunger coated as described in this patent would have to be machined to the required tolerances before the coating was applied and therefore, could not be formed as precisely as might be desired.

A mechanical resistant coating which improves the service life of tools is disclosed in U.S. Pat. No. 4,871,434, issued to Munz et al. This coating is formed by a vapor deposition process wherein a selected one of a large number of metals, such as chromium, is sputtered onto the surface of the tool using a magnetron-cathode sputtering technique. Specifically, the tool is sputtered in a vacuum chamber which includes at least one noble gas and at least one reactive gas, such as nitrogen, to form the coating. The coating is built up on the surface of the substrate an any inaccuracies in the uniformity of the built up coating will be reflected in the dimensional accuracy of the coated component. Again, however, the wear-resistant layer is applied in a one step process, and any final machining, especially the kind of detailed machining required to produce fuel injectors, is very difficult. Munz et al., moreover, do not suggest that the process described in their patent could be used to coat components capable of withstanding the severe conditions encountered in an internal combustion engine environment.

A commercially available salt bath process known as Wellworthy TC Chrome is widely used to apply a wear-resistant chromium oxide coating on the surface of piston rings. However, because the TC chrome coating is a salt bath process which contains cyanide compounds, it is environmentally unacceptable in the United States.

Consequently, an environmentally acceptable method is needed for producing a coating on the surface of internal combustion engine component parts to protect them from wear, to enhance their dimensional stability and to allow resizing or machining of the coated component parts to precise tolerances. Specifically, a method for producing a coating on an efficiently operating fuel injector plunger which is wear-resistant, dimensionally stable and permits machining to the tolerances required, is also needed so that the fuel injector is able to operate efficiently under the severe engine operating conditions created by stringent emissions standards. The prior art has failed to disclose the production of such a coating, for a fuel injector plunger or any other internal combustion engine component.

SUMMARY OF THE INVENTION

Therefore, a primary object of the present invention is to overcome the deficiencies of the prior art, as described above, and specifically, to provide a wear-resistant coating for internal combustion engine components and an environmentally acceptable method for producing such coatings.

Another object of the present invention is to provide an internal combustion engine component part which is highly wear-resistant and dimensionally stable.

Yet another object of the present invention is to provide an internal combustion engine component part coated with a wear-resistant coating including a base layer of chromium and a surface layer of chromium nitride.

Still another object of the present invention is to provide a coating for an internal combustion engine component which will render a component previously coated with chromium highly wear-resistant and dimensionally stable.

A further object of the present invention is to provide a method for coating an internal combustion engine component part which renders the part wear-resistant and dimensionally stable, which includes the steps of first coating the surface of the component with chromium and then subjecting the chromium coated component to a reactive gaseous plasma that causes the gas to react with the chromium to form a layered chromium and chromium nitride coating.

The foregoing objects are achieved by providing a wear-resistant coating for internal combustion engine component parts which allows the parts to withstand severe engine operating conditions for sustained periods of engine operation. The coating is produced on the component by essentially a two step method. First, the engine component part is coated with chromium to form a base layer. Second, the chromium-coated engine part is subjected to a reactive gaseous plasma in a reaction chamber at a temperature and pressure which causes the reactive gas to react with the chromium to form a second, wear-resistant layer on top of the base layer. Preferably, the reactive gas of the plasma is a mixture of hydrogen and nitrogen, which forms a chromium nitride wear-resistant layer on the surface of the part. The internal combustion engine component part, thus coated, has a chromium base layer and a chromium nitride surface layer, which, together, are very wear resistant and make the component part dimensionally stable. This coating is especially well-suited to fuel injector plungers. Moreover, any resizing of the fuel injector plunger required can be done after the chromium coating is applied but before the wear-resistant chromium nitride coating is formed. The wear-resistant chromium is a diffusion type coating rather than a built up coating and, therefore, does not introduce any dimensional inaccuracy into the component.

The various features, objects and advantages of the present invention will become apparent from the following Brief Description of the Drawings and Detailed Description of the Invention.

DETAILED DESCRIPTION OF THE INVENTION

The coating of the present invention is useful for protecting internal combustion engine component parts from wear. Due to heightened emission standards, engines are forced to operate under increasingly severe engine operating conditions. A component part that includes the coating of the present invention is protected by a wear resistant, dimensionally stable surface coating that Will allow the component part to maintain its dimensional integrity. This coating is especially suited for fuel injector plungers because of their harsh operating environment. Moreover, because the coating process of the present invention is conducted in two steps, any necessary resizing of the fuel injector plunger can be done before the final exterior surface of the coating has been formed.

Figure 1:
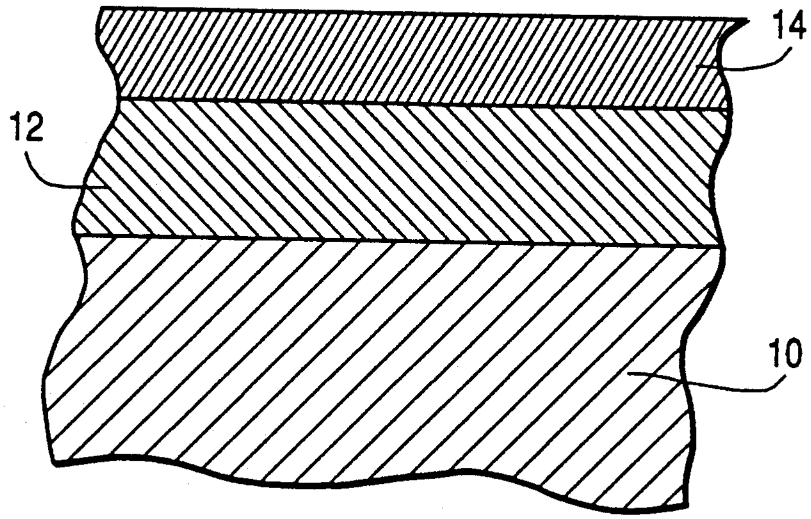
FIG. 1 is a cross-sectional view of the surface of an engine component including a wear-resistant coating formed in accordance with the present invention.

For a clearer understanding of the present invention, attention is initially directed to FIG. 1. FIG. 1 illustrates a surface of an internal combustion engine component 10 coated according to the present invention. The component 10 includes a base layer 12 of chromium and an exterior surface layer 14 of chromium which has reacted with a reactive gaseous plasma to form a wear-resistant layer. Exterior surface layer 14 will substantially increase the service life of component 10 and allow it to withstand severe engine operating and other adverse environmental conditions. Although component 10 is preferably an internal combustion engine part, it may be any other component part or device which can be chromium plated or coated to enhance wear resistance in severe operating environments.

The coating of the present invention is especially suitable for internal combustion engine fuel injector plungers. Because of the intense pressure and temperatures exerted on a fuel injector during normal engine operation, it is difficult for the plunger to maintain its precise dimensional integrity after a sustained period of engine operation. The present invention provides the surface of a fuel injector plunger with a highly wear-resistant coating that maintains the dimensional integrity of the plunger. In addition, a fuel injector plunger must be formed with precise surface grooves and flow passages and machined to extremely close tolerances. Because the coating of the present invention is applied in essentially two main steps, any required resizing or machining of the plunger can be accomplished before the final wear-resistant layer is formed.

The process of coating an engine part according to the present invention includes essentially two major steps. The part to be coated is first coated with chromium, preferably by electroplating. Conventional electroplating processes can be used for this step. It is at this point that any required resizing of the fuel injector plunger or other part can be accomplished because the chromium base layer can still be machined without damaging the plunger body or the coating. The chromium plated part is then subjected to a selected reactive gaseous plasma in a suitable reaction chamber to form the wear-resistant, dimensionally stable surface layer.

The reactive gas plasma is preferably formed from a mixture of nitrogen and hydrogen. Other reactive gases, such as anhydrous ammonia and any one of a number of suitable hydrocarbons, including methane and the like, could also be used to form the reactive gas plasma. At least a gaseous nitrogen source must be used to form the reactive gas plasma. However, one or more of a large number of other gases could also be included with the nitrogen source. The relative amounts of the gases selected for this purpose will depend on the size of the reaction chamber used for the coating process.

The internal combustion engine component to be coated is electrically insulated from and placed in the reaction chamber. Several components may be coated simultaneously if the chamber is large enough. The chamber is then evacuated to a vacuum level within the range of 1 to 10 Torr. After the reaction chamber has been evacuated, the reactive gas is introduced into the chamber.

An electrical potential of about 300 to 1100 volts is applied between the walls of the reaction chamber and the component to be coated, and the temperature is raised to within the range of 600° to 1000° F. A preferred temperature is about 1000° F., although a lower temperature may be desirable in some instances. The temperature can be increased and the electrical potential can be applied simultaneously, or one before the other. In addition, direct or indirect heating can be used to raise the temperature of the reaction chamber.

The time required to produce a surface layer 14 that is sufficiently wear-resistant and dimensionally stable can range from about 10 to about 60 hours. The actual time required will depend on the chromium nitride coating depth desired and the temperature of the reactive gas.

The nitrogen-containing reactive gas will react with the chromium of the base layer 12 to form the surface layer 14. This layer will include the compounds CrN and $Cr_2N$, which contribute to the high wear resistance and dimensional stability of the engine or other component coated as described.

Some finish-type grinding can be performed on the coated engine component after the formation of the chromium nitride surface layer, if necessary. However, this surface layer is responsible for the high Wear resistance and stability of the coated component. Consequently, it is not desirable to perform more than minimal grinding at this stage to preserve the integrity of the coating.

A series of tests were conducted on engine component parts to determine the degree of protection provided by the coating of the present invention. Specifically, tests were conducted on chromium nitride layers formed, as described above, on the surfaces of fuel injector plungers. An Auger depth profile analysis of the nitride layer thickness was performed on the fuel injector plungers which had been subjected to different process coating times (12, 20 and 30 hours). Three samples of each process coating time, produced by machining sections of approximately ½ inch in length, were tested. The analysis evaluated an Auger profile of nitrogen through approximately 1.5 micrometers. Iterative steps of the Auger scan were followed by surface sputtering until the coating was penetrated and the thickness was determined. Disappearance of the nitrogen peak was taken as evidence that the coating had been penetrated, so that the depth of the layer could be determined.

A series of preliminary profiles determined that optimal and consistent removal of chromium nitride surface layers was achieved using an oxygen ion beam. Ion beam parameters employed during acquisition of the profiles therein were as follows: ion beam current (at the sample)=2.0 microamperes, beam voltage=5 kilovolts and beam raster size=500 micrometers. The electron beam used for Auger electron excitation during the depth profile analyses consisted of 100 nanoamperes electron current (at the sample) generated by an accelerating potential of 3.0 kilovolts. Samples were all tilted at 30° and aligned facing the ion gun, so as to minimize geometric artifacts from sample to sample. Auger electron spectra were taken before and after each depth profile was obtained. For samples representing each process cycle time, a series consisting of a pre-profile Auger spectrum, a depth profile plot with an ion beam sputter duration of 40 minutes and a post-profile Auger spectrum were obtained. Results for samples from 12 hour, 20 hour and 30 hour cycle times are presented in FIGS. 2 through 4, 5 and 6 and 8 through 10, respectively.

Figure 2:
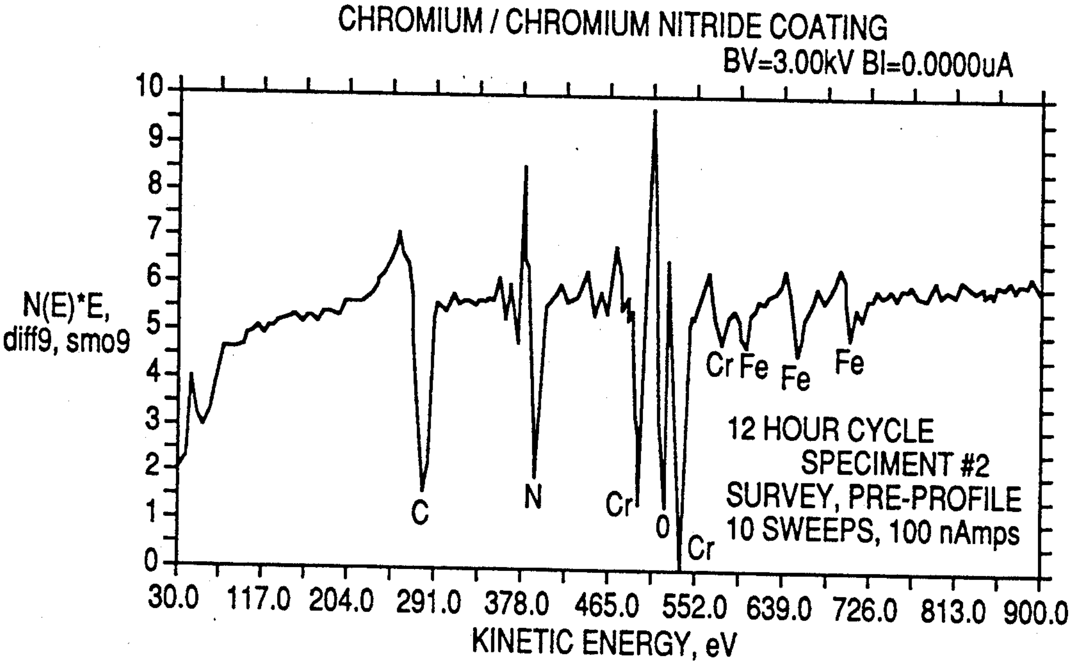
FIG. 2 illustrates a pre-profile Auger electron survey scan of a sample fuel injector plunger subjected to a 12 hour coating cycle showing strong nitrogen presence.

Specifically, FIG. 2 depicts the pre-profile Auger electron survey scan of 12 hour cycle specimen #2, showing strong nitrogen from the nitride layer and strong carbon and oxygen from surface contamination.

Figure 3:
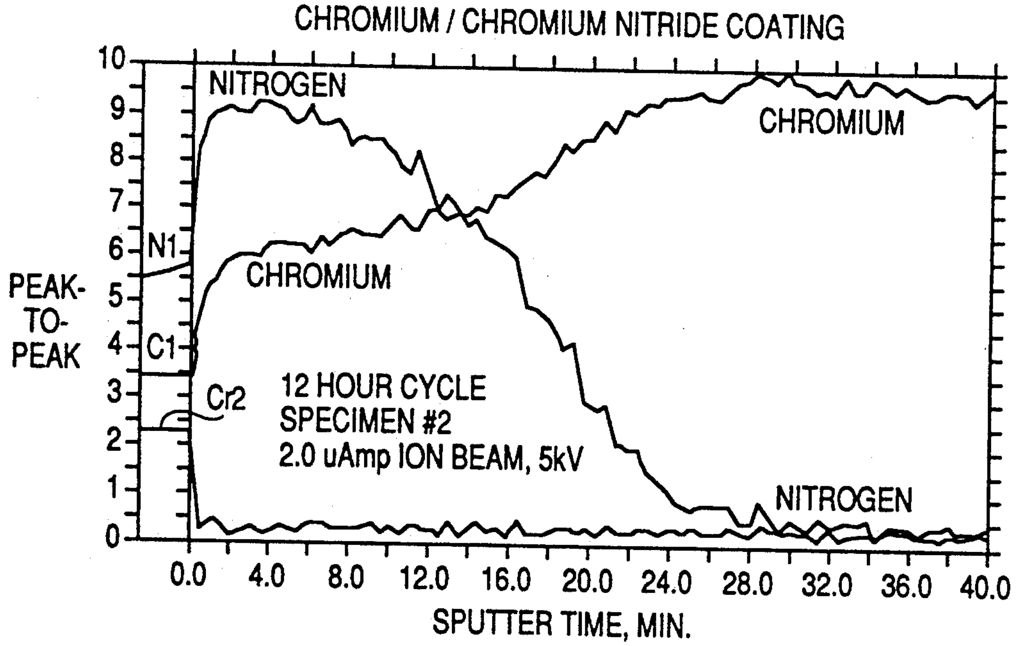
FIG. 3 illustrates a coating depth profile plot of the sample of FIG. 2.

FIG. 3 shows the depth profile plot of 12 hour cycle sample #2, with ion beam sputter duration of 40 minutes. Nitrogen intensity decreases and chromium increases as the beam traverses the nitride layer and its interface into the chromium substrate.

Figure 4:
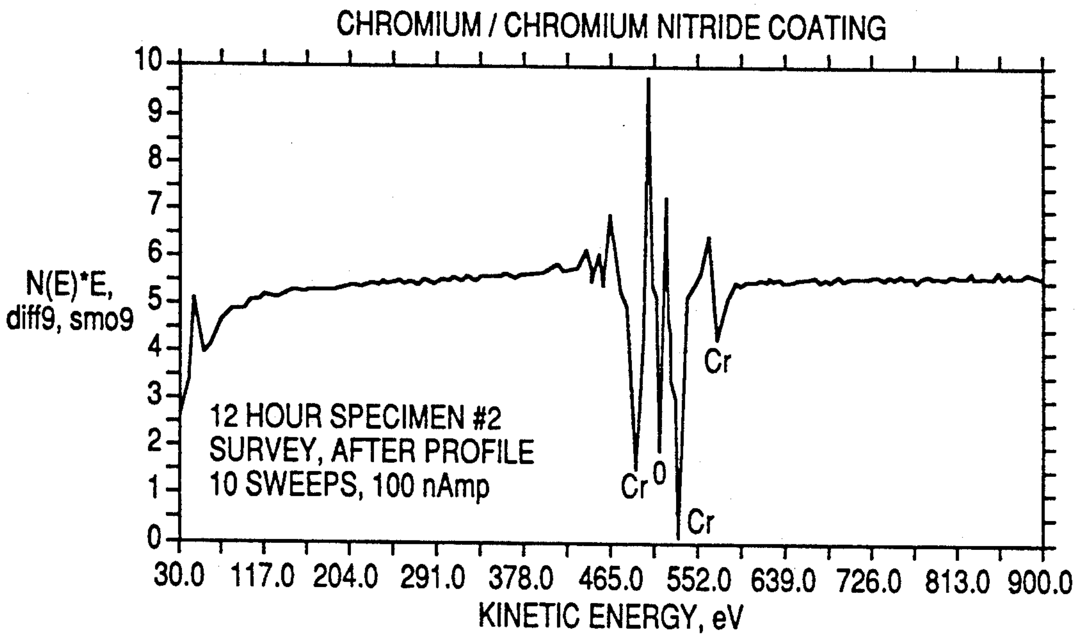
FIG. 4 illustrates a post-profile Auger electron survey scan of the sample of FIG. 2 showing nitrogen fully depleted.
Figure 5:
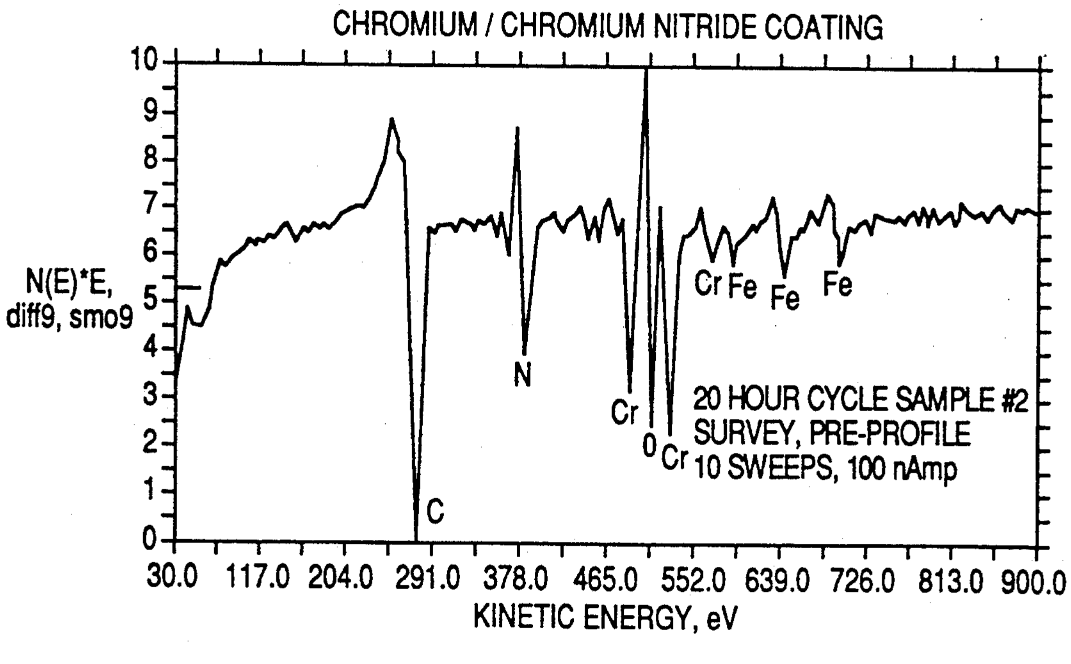
FIG. 5 illustrates a pre-profile Auger electron survey scan of a sample fuel injector plunger subjected to a 20 hour coating cycle showing strong nitrogen presence.

FIG. 4 depicts the post-profile Auger electron survey scan of 12 hour cycle specimen #2, showing nitrogen fully depicted. Residual oxygen is that implanted by the oxygen ion beam. FIG. 5 shows the pre-profile Auger electron survey scan of 20 hour cycle specimen #2.

Figure 6:
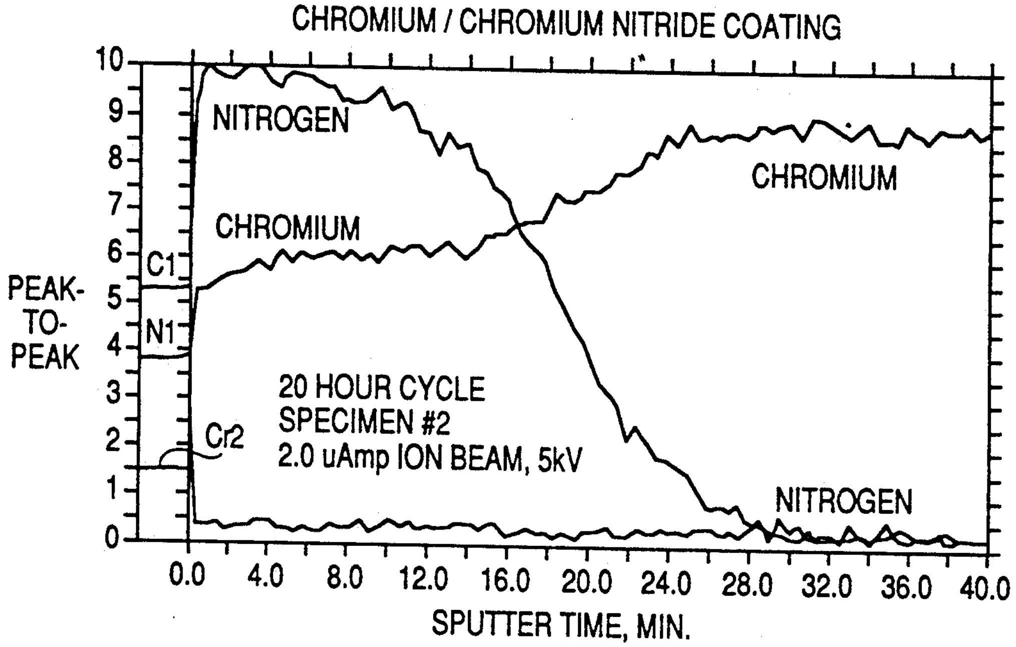
FIG. 6 illustrates a coating depth profile plot of the sample of FIG. 5.
Figure 7:
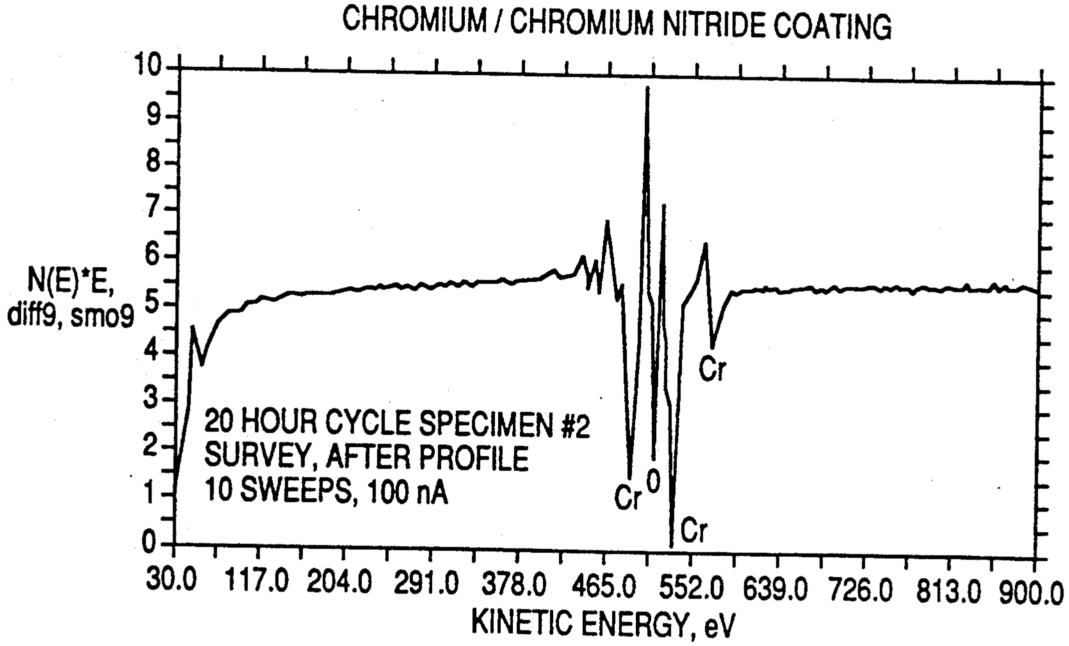
FIG. 7 illustrates a post-profile Auger electron survey scan of the sample of FIG. 5 showing nitrogen fully depleted.

FIG. 6 depicts the depth profile plot of the 20 hour cycle specimen #2. FIG. 7 shows the corresponding post-profile Auger electron survey scan, confirming nitrogen to be fully depleted.

Figure 8:
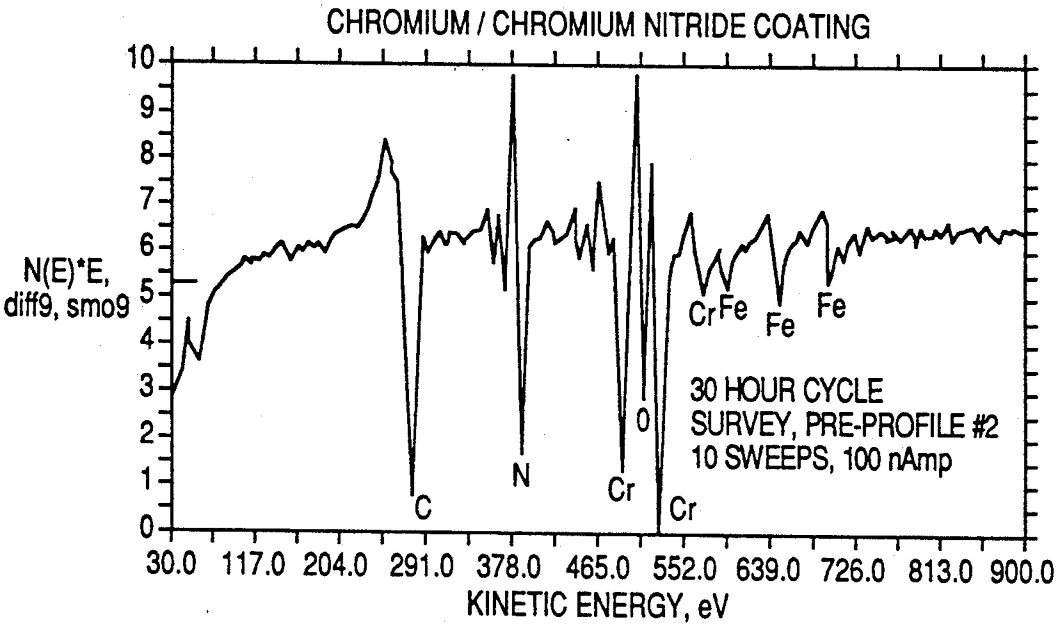
FIG. 8 illustrates a pre-profile Auger electron survey scan of a sample fuel injector plunger subjected to a 30 hour coating cycle showing strong nitrogen presence.
Figure 9:
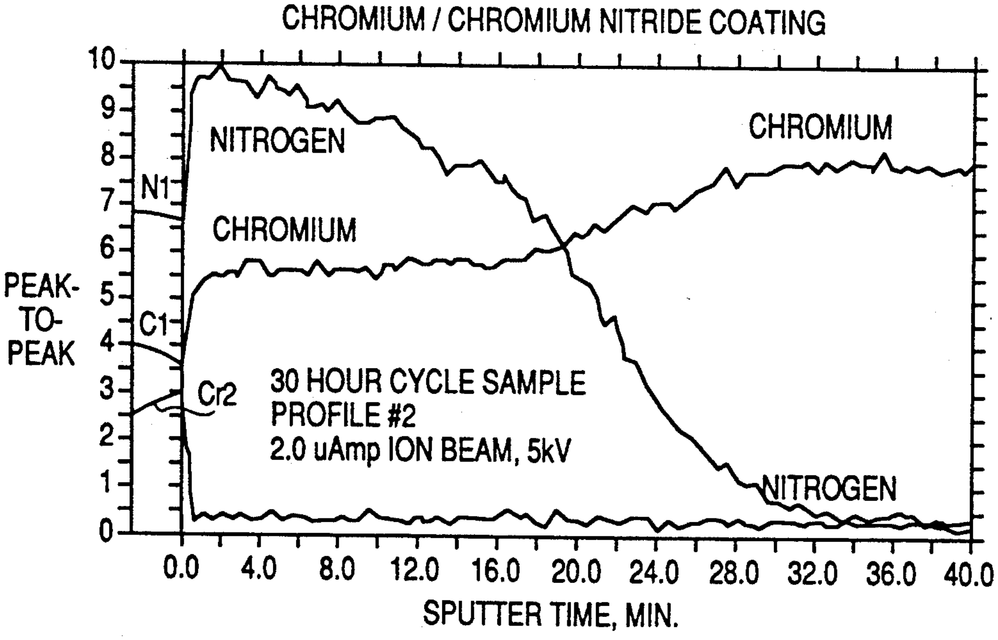
FIG. 9 illustrates a coating depth profile plot of the sample of FIG. 8.

FIG. 8 depicts the pre-profile Auger electron survey scan for 30 hour cycle specimen #2. FIG. 9 shows the corresponding depth profile plot.

Figure 10:
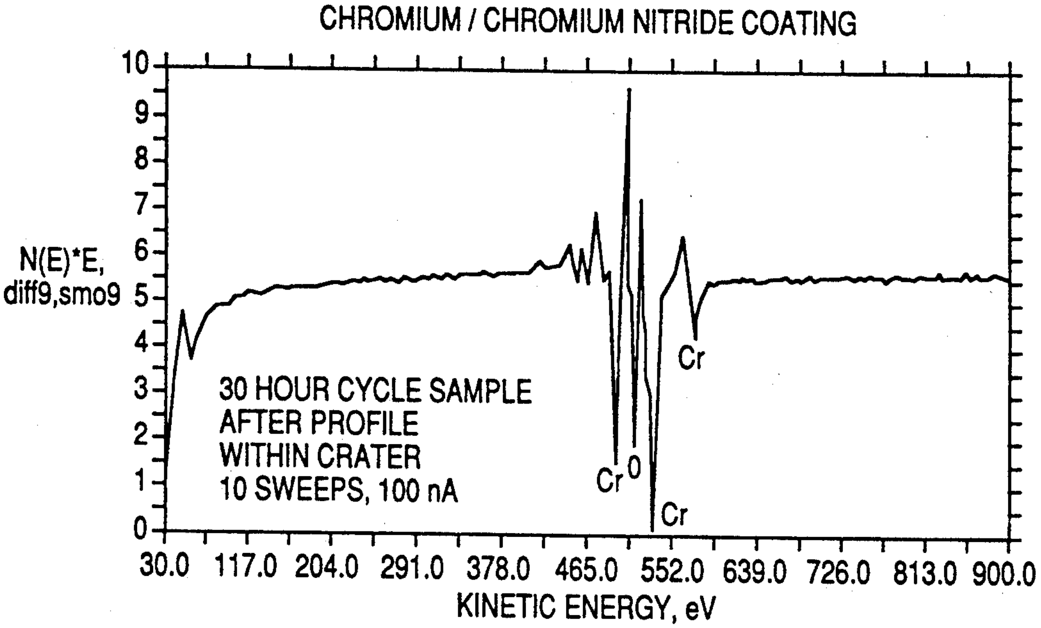
FIG. 10 illustrates a post-profile Auger electron survey scan of the sample of FIG. 8 showing nitrogen fully depleted.
Figure 11:
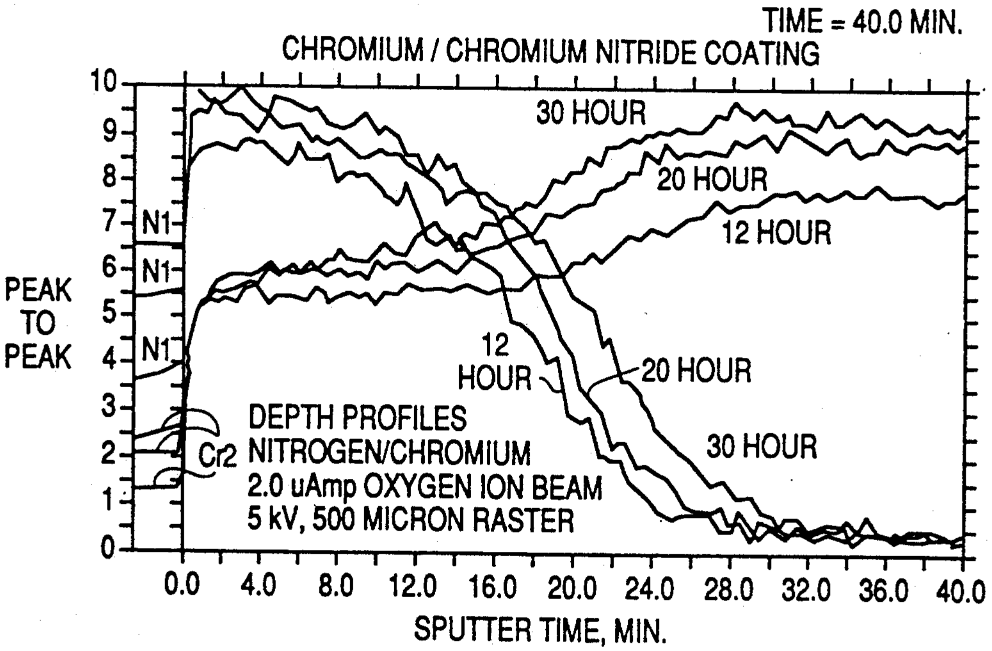
FIG. 11 illustrates a composite depth profile for 12, 20 and 30 hour coating cycle samples.

FIG. 10 depicts the 30 hour cycle sample post-profile Auger electron survey scan, confirming complete nitrogen depletion. FIG. 11 is a composite plot of depth profiles for all three coating cycle times (12 hour, 20 hour and 30 hour).

Depths were determined for analysis layers where the nitrogen signal in the Auger electron spectra was completely depleted. Comparison depths at the estimated interfaces (those crossover points between decreasing nitrogen signals and enhanced chromium signals) were also determined for each process cycle time. All depth data are given in Angstrom units.

| | DEPTHS (Å) | |
|---|---|---|
| Method | Nitrogen Signal Depletion | Interface Crossover |
| 12 hour cycle | 7700 | 3800 |
| 20 hour cycle | 8100 | 4600 |
| 30 hour cycle | 9200 | 5500 |

An error range of at least 7% is inherent in the data, based solely upon scatter in profilometer data used in the determination of sputter rates.

The foregoing tests clearly establish that the application of a nitride surface layer to a previously formed chromium base layer produces a highly wear-resistant structure that maintains its dimensional integrity.

INDUSTRIAL APPLICABILITY

A wear-resistant coating formed in accordance with the present invention has particular utility for combustion engine components which are required to withstand severe engine operating conditions. However, any machine component part required to function in a similarly severe environment under close tolerances could also be coated in accordance with the present invention. The coating is especially useful for fuel injector plungers that must maintain their dimensional integrity while operating under high temperatures and pressures. Because the coating is applied in a tow step process, final grinding of a fuel injector plunger can be accomplished after the chromium base layer is formed but before the chromium nitride surface is formed to ensure that the structural details of the plunger are correct and precise before the wear-resistant coating is formed on its surface.

It is understood, however, that various additional changes and modifications in the form and detail of the present invention illustrated in detail above may be made without departing from the scope and spirit of the present invention, as well as the invention's use in a variety of application. It is, therefore, the intention of the inventors to be limited only by the following claims.

We claim:

1. A method for coating a component of an internal combustion engine to produce a wear-resistant, dimensionally stable coating on the surface of the component including the steps of:

(a) applying first a base coating layer of chromium to said surface to form a chromium coated component;

(b) placing the chromium coated component in a reaction chamber;

(c) applying a vacuum to said reaction chamber to evacuate said chamber;

(d) introducing a nitrogen-containing reactive gas into said reaction chamber;

(e) applying en electrical potential between the chromium coated component and the reaction chamber; and (f) raising the temperature of the gas in the reaction chamber for a time sufficient to form a chromium nitride surface coating of a desired depth on said base coating layer.

2. The method described in claim 1, wherein said vacuum is within the range of 1 to 10 Torr.

3. The method described in claim 1, wherein said reactive gas contains at least one gas selected from the group consisting of nitrogen and anhydrous ammonia.

4. The method described in claim 3, wherein said reactive gas further includes at least one gas selected from the group consisting of hydrogen and methane.

5. The method described in claim 1, wherein said electrical potential is within the range of 300 to 1000 volts.

6. The method described in claim 1, wherein said temperature is within the range of 600° to 1150° F.

7. The method described in claim 1, wherein said time is within the range of 10 to 60 hr.

8. A method for coating a component of an internal combustion engine to produce a wear-resistant dimensionally stable coating on the surface of the component including the steps of:

(a) applying first a base coating layer of chromium to said surface to form a chromium coated component;

(b) placing the chromium coated component in a reaction chamber;

(c) applying a vacuum within the range of 1 to 10 Torr to said reaction chamber to evacuate said chamber;

(d) introducing a nitrogen-containing reactive gas selected from the group consisting of nitrogen and anhydrous ammonia into said reaction chamber;

(e) applying an electrical potential between the chromium coated component and the reaction chamber; and (f) raising the temperature of the gas in the reaction chamber for a time sufficient to form a chromium nitride surface coating of a desired depth on said base coating layer.

9. The method described in claim 8, wherein said electrical potential is within the range of 300 to 1000 volts.

10. The method described in claim 9, wherein said temperature is within the range of 600° to 1150° F.

11. The method described in claim 10, wherein said time is within the range of 10 to 60 hr.

12. A method for coating a fuel injector plunger of an internal combustion engine to produce a wear-resistant, dimensionally stable coating on the surface of the fuel injector plunger including the steps of:

(a) applying first a base coating layer of chromium by electroplating to said surface to form a chromium coated component;

(b) placing the chromium plated component in a reaction chamber;

(c) applying a vacuum within the range of 1 to 10 Torr to said reaction chamber to evaluate said chamber;

(d) introducing a nitrogen-containing reactive gas selected from the group consisting of nitrogen and anhydrous ammonia into said reaction chamber;

(e) applying an electrical potential within the range of 300 to 1100 volts between the chromium coated component and the reaction chamber; and (f) raising the temperature of the gas in the reaction chamber to a temperature within the range of 600° to 1150° F. for a time in the range of 10 to 60 hours to form a chromium nitride surface coating of a desired depth on said base coating layer.

13. The method described in claim 12, wherein the temperature is 1000° F.

14. A method for coating a component of an internal combustion engine to produce a wear-resistant, dimensionally stable coating on the surface of the component including the steps of:

(a) applying a base coating layer of chromium to said surface to form a chromium coated component;

(b) placing the chromium coated component in a reaction chamber;

(c) applying a vacuum to said reaction chamber to evacuate said chamber;

(d) introducing a nitrogen-containing reactive gas into said reaction chamber;

(e) applying an electrical potential between the component and the reaction chamber; and (f) raising the temperature of the gas in the reaction chamber for a time sufficient to form a chromium nitride surface coating of a desired depth on said base coating layer wherein said temperature is 1000° F.

* * * * *